(12) United States Patent
Pei

(10) Patent No.: US 8,545,632 B2
(45) Date of Patent: Oct. 1, 2013

(54) COATING HOLDER AND COATING DEVICE HAVING SAME

(75) Inventor: Shao-Kai Pei, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 636 days.

(21) Appl. No.: 12/820,056

(22) Filed: Jun. 21, 2010

(65) Prior Publication Data
US 2011/0247558 A1 Oct. 13, 2011

(30) Foreign Application Priority Data

Apr. 9, 2010 (TW) ............................... 99111069 A

(51) Int. Cl.
*C23C 14/50* (2006.01)
*C23C 16/00* (2006.01)

(52) U.S. Cl.
USPC ......... 118/730; 118/723 R; 118/728; 118/729

(58) Field of Classification Search
None
See application file for complete search history.

(56) References Cited

U.S. PATENT DOCUMENTS

| | | | |
|---|---|---|---|
| 2,260,471 A * | 10/1941 | McLeod | 118/731 |
| 4,034,704 A * | 7/1977 | Wossner et al. | 118/730 |
| 4,058,430 A * | 11/1977 | Suntola et al. | 427/255.13 |
| 5,138,974 A * | 8/1992 | Ciparisso | 118/731 |
| 5,302,209 A * | 4/1994 | Maeda et al. | 118/719 |
| 6,105,534 A * | 8/2000 | Siniaguine et al. | 118/723 EB |
| 6,227,933 B1 * | 5/2001 | Michaud et al. | 446/462 |
| 7,748,341 B2 * | 7/2010 | Muster et al. | 118/52 |
| 7,785,456 B2 * | 8/2010 | Seddon et al. | 204/298.27 |

* cited by examiner

*Primary Examiner* — Keath Chen
*Assistant Examiner* — Aiden Lee
(74) *Attorney, Agent, or Firm* — Altis & Wispro Law Group, Inc.

(57) ABSTRACT

A coating holder for holding a plurality of workpieces includes a rotating shaft, a first driving member, a plurality of hanging arms, a plurality of supporting trays, and a plurality of second driving members. The first driving member is configured for driving the rotating shaft to rotate. The hanging arms extend from the rotating shaft. Each hanging arm includes a free end distal from the rotating shaft. The supporting trays are configured for holding the workpieces. The second driving members are fixed in the respective free ends and are connected to the respective supporting trays. The second driving members are configured for driving the supporting trays to rotate.

18 Claims, 6 Drawing Sheets

COATING HOLDER AND COATING DEVICE HAVING SAME

BACKGROUND

1. Technical Field

The present disclosure relates to coating technology and, particularly, to a coating holder and a coating device having the coating holder.

2. Description of Related Art

Generally, in a coating process for workpieces (e.g., lenses), a holder is used for holding the workpieces. After a surface of each workpiece is coated, the workpiece is manually turned over on the holder so that another surface of the workpiece can be coated. This process is time-consuming.

Therefore, it is desirable to provide a coating holder and a coating device using the same, which can overcome the above-mentioned problems.

DETAILED DESCRIPTION

Figure 1:
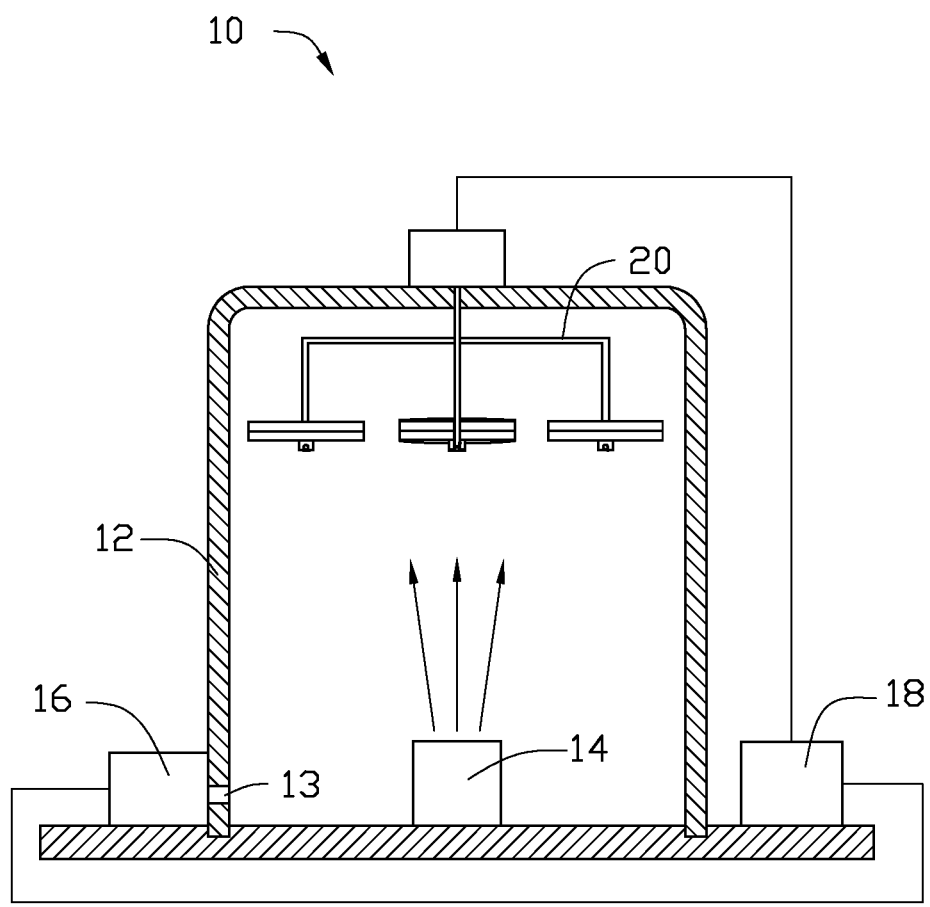
FIG. 1 is a schematic, sectional view of a coating device including a coating holder, according to a first exemplary embodiment.

Referring to FIG. 1, a coating device 10 for coating a plurality of workpieces (not shown), according to a first exemplary embodiment, includes a vacuum container 12, a plasma source 14, a vacuum pump 16, a controller 18, and a coating holder 20. The coating device 10 could be used in an ion-assisted deposition process.

The vacuum container 12 defines a gas outlet 13. The vacuum pump 16 is connected to the gas outlet 13 outside the vacuum container 12. The vacuum pump 16 is configured for vacuuming the vacuum container 12 through the gas outlet 13. The plasma source 14 is positioned on the bottom of the vacuum container 12 and is configured for providing vaporized material to be coated on the plurality of workpieces (not shown). The coating holder 20 is mounted to the top of the vacuum container 14 facing the plasma source 14. The controller 18 is positioned outside the vacuum container 12 and is electrically connected to the vacuum pump 16 and the coating holder 20. The controller 18 is configured for controlling the vacuum pump 16 and the coating holder 20.

Figure 2:
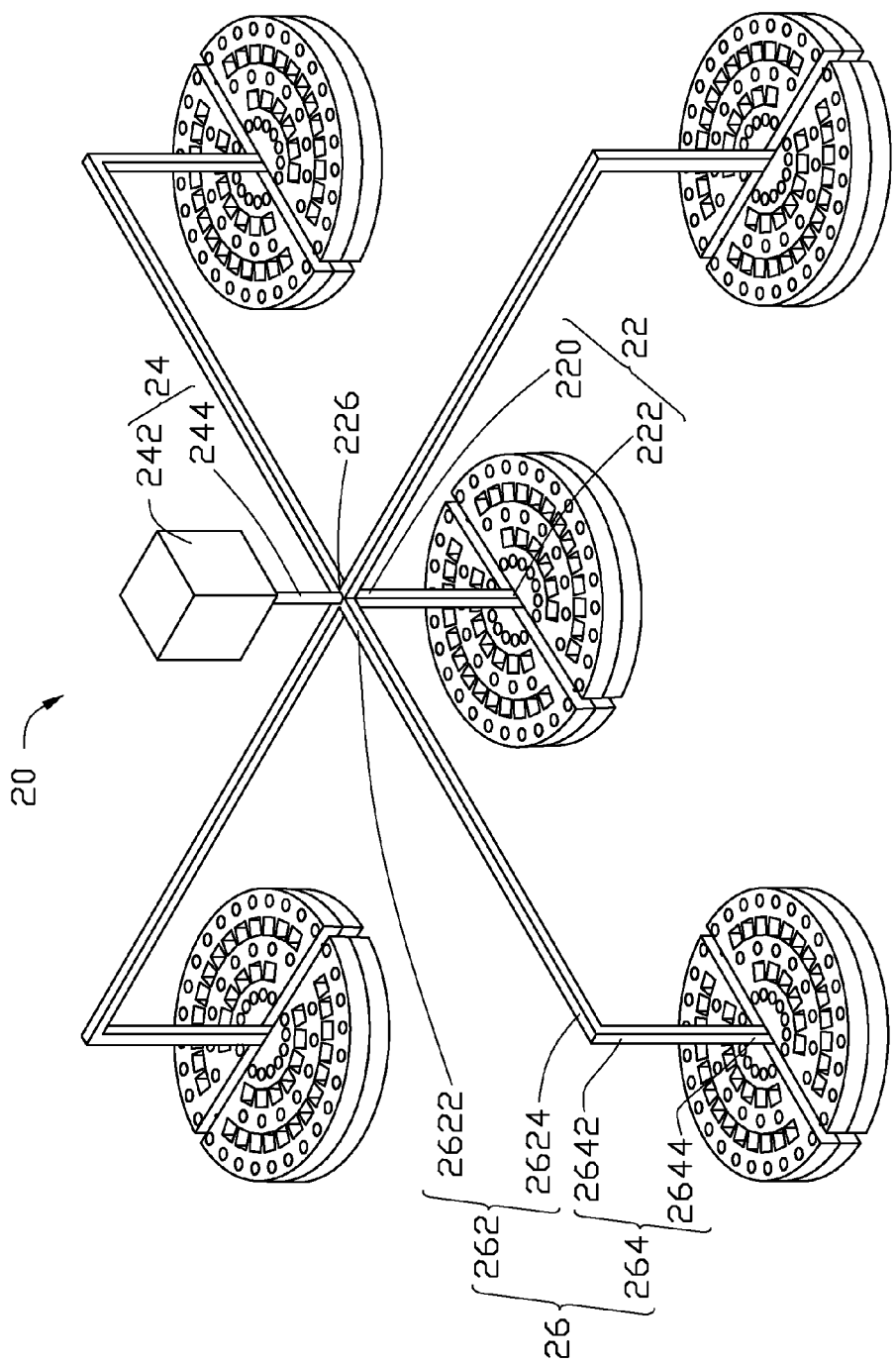
FIG. 2 is a schematic, isometric view of the coating holder of FIG. 1, showing the coating holder in a first state.
Figure 3:
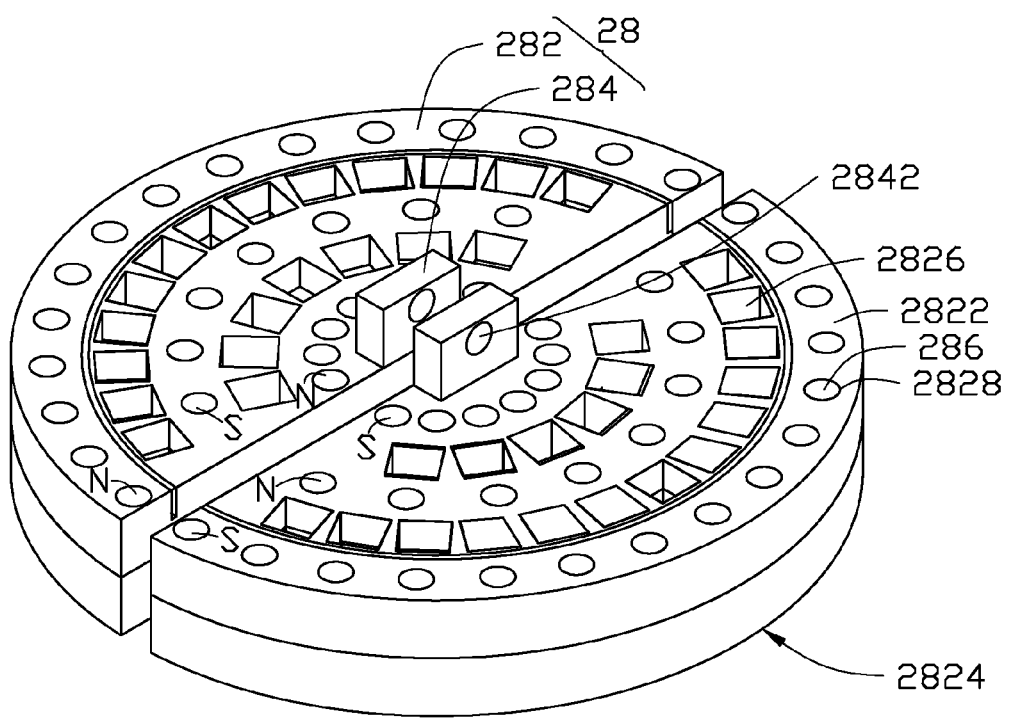
FIG. 3 is a partially, enlarged isometric view of the coating holder of FIG. 1.
Figure 3:
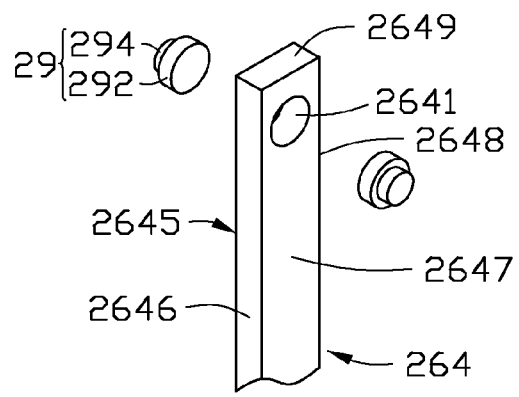

Referring to FIG. 2 together with FIG. 3, the coating holder 20 is configured for holding the plurality of workpieces (not shown), such as lenses. The coating holder 20 includes a rotating shaft 22, a first driving member 24, four hanging arms 26, ten supporting trays 28, and ten second driving members 29.

The rotating shaft 22 is substantially a cuboid shape and includes a top end 220 and a bottom end 222. The top end 220 and the bottom end 222 are positioned at opposite sides of the rotating shaft 22. The top end 220 defines a fixing hole 226.

The first driving member 24 is a servomotor. The first driving member 24 includes a first stator 242 and a first rotor 244 extending from the first stator 242. The first stator 244 is fixedly positioned on the top of the vacuum container 12. The first driving member 24 is fixedly connected to the rotating shaft 22 via the first rotor 244 engages in the fixing hole 226. The first driving member 24 is electrically connected to the controller 18 and is configured for driving the rotating shaft 22 to rotate about a first axis.

The four hanging arms 26 perpendicularly extend from the rotating shaft 22 and are arranged on four sidewalls of the rotating shaft 22. Each hanging arm 26 includes a connecting portion 262 and a hanging portion 264 substantially parallel with the rotating shaft 22. The connecting portion 262 connects the hanging portion 264 to the rotating shaft 22. In particular, the connecting portion 262 includes a first end 2622 and a second end 2624. The first end 2622 and the second end 2624 are positioned at opposite sides of the connecting portion 262. The hanging portion 264 includes a third end 2642 and a free end 2644 distal from the rotating shaft 22. The third end 2642 and the free end 2644 are positioned at opposite sides of the hanging portion 264. The first end 2622 is perpendicular to the rotating shaft 22. The third end 2642 is perpendicularly connected to the second end 2624. The free end 2644 is substantially a cuboid shape and includes a first surface 2645, a second surface 2646, a third surface 2647, a fourth surface 2648, and a fifth surface 2649. The first surface 2645 is substantially parallel to the third surface 2647. The second surface 2646 is substantially parallel to the fourth surface 2648. The fifth surface 2649 substantially perpendicularly connects the first surface 2645, the second surface 2646, the third surface 2647, and the fourth surface 2648. A first through hole 2641 is defined in the free end 2644 through the first surface 2645 to the fourth surface 2648.

Each supporting tray 28 includes a main body 282 and a protrusion 284 extending from the main body. The main body 282 is substantially a half-column and includes a first side 2822 and a second side 2824. The first side 2822 and the second side 2824 are positioned at opposite sides of the main body 282. The protrusion 284 extends from the first side 2822. A second through hole 2842 is defined in the protrusion 284. The main body 282 defines a plurality of first recesses 2826 and a plurality of second recesses 2828 spaced from the first recesses 2826. The first recesses 2826 are arranged in fan-shaped lines and are configured for receiving the workpieces. The second recesses 2828 are arranged in substantially a fan-shape and are configured for receiving magnets 286. The magnetic poles of the magnets 286 are exposed from the first side 2822 and the second side 2824. The magnetic poles of the magnets 286 in a fan-shaped line are contrary to those of the magnets 286 in adjacent fan-shaped line.

The second driving member 29 is a servomotor. The second driving member 29 includes a second stator 292 and a second rotor 294 extending from the second stator 292. Two second stators 292 are fixed in the first through hole 2641, and two corresponding rotors 294 extend from the first through hole 2641 to engage in the second through hole 2842 so that the second driving member 29 is fixedly connected to the respective supporting tray 28. Therefore, two supporting trays 28 are rotatably connected to opposite surfaces 2645 and 2647 of the free end 2644. The magnetic poles of the magnets 286 in substantially a fan-shaped line of a supporting tray 28 are contrary to those of the magnets 286 in a corresponding fan-shaped line of a corresponding supporting tray 28. In this embodiment, three fan-shaped lines magnets 286 are received in the second recesses 2828 of each supporting tray 28. Two supporting trays 28 form a circle. The magnetic poles of the magnets 286 of the inner circle of the two supporting trays 28 are north and south. The magnetic poles of the magnets 286 of the middle circle of the two supporting trays 28 are south and north. The magnetic poles of the magnets 286 of the outer circle of the two supporting trays 28 are north and south. The second driving member 29 is electrically connected to the controller 18 and is configured for driving the respective supporting tray 28 to rotate about a second axis substantially perpendicular to the first axis. In this embodiment, the supporting trays 28 are rotatable about the second axis between a first position where the first sides 2822 of the supporting trays 28 are substantially located on a common plane and face upward, and a second position where the second sides 2824 of the supporting trays 28 are substantially located on the common plane and face upward.

In other embodiments, the free end 2644 can omit the first through hole 2641. In this situation, the two stators 292 are fixed on the first surface 2645 and the third surface 2647. Two rotors 294 extend from the first surface 2645 and the third surface 2647 and are connected to the protrusions 284 so that two supporting trays 28 are rotatably connected to the free end 2644. The supporting trays 28 may be pivotedly coupled to the respective free ends 2644, and each second driving member 29 is configured for driving the respective supporting tray 28 to rotate about the second axis. The bottom end 222 of the rotating shaft 22 is a free end. The bottom end 222 may be equipped with two supporting trays 28, or may not be equipped with any supporting trays 28. In this embodiment, two supporting trays 28 are connected to the bottom end 222 in the same way as the two supporting trays 28 are connected to the free end 2644.

Figure 4:
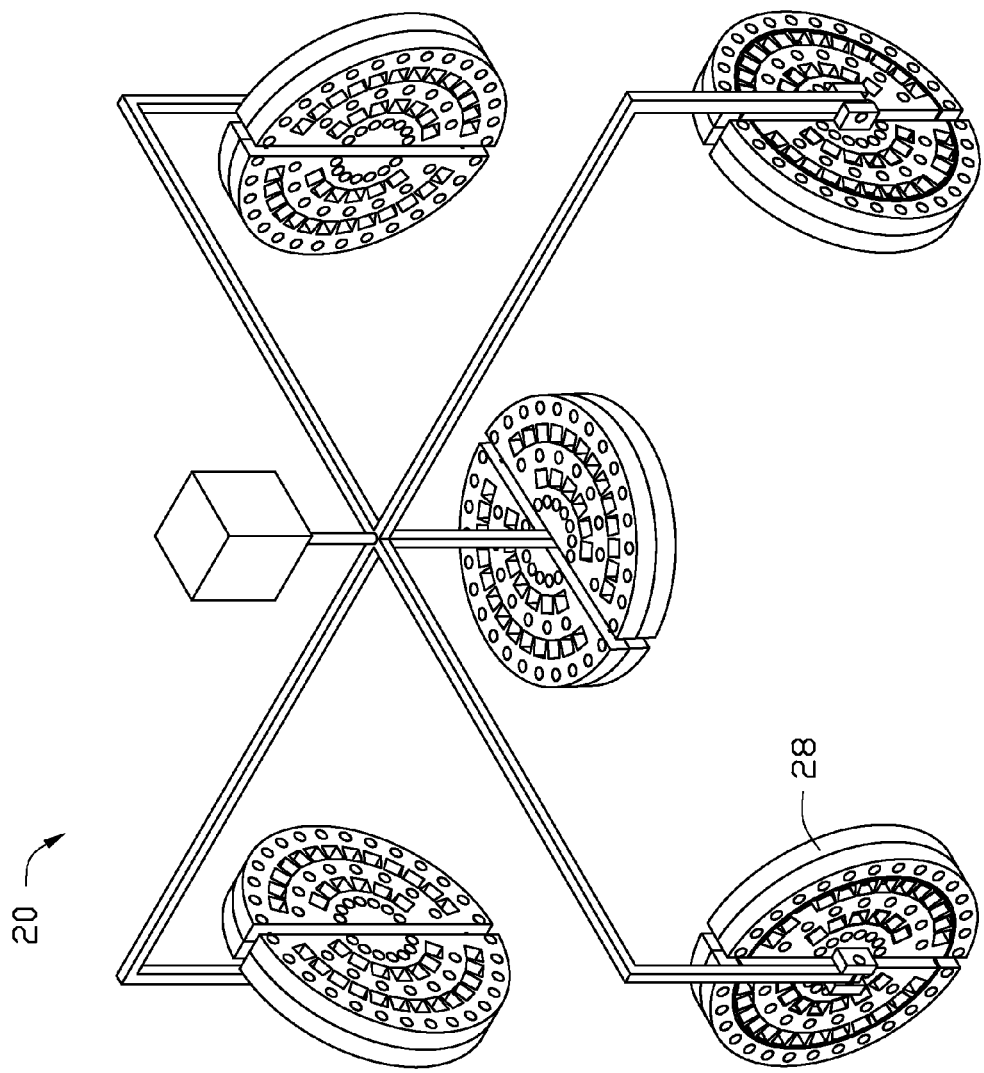
FIG. 4 is similar to FIG. 2, but showing the coating holder in a second state.

During a coating process, the plasma source 14 provides evaporated material to be coated on a surface of the workpieces received in the first recesses 2826. The four hanging arms 26 rotate with the rotation of the rotating shaft 22 so that the workpieces are coated uniformly. After a surface of the workpiece is coated, the second rotor 294 is activated by the controller 18 to drive the supporting trays 28 to rotate 180 degrees about the second axis so that another surface of the workpiece can be coated. At the same time, magnetic field produced by the magnets 186 can increase intensity and energy of the evaporated material so that the film coated on the workpieces becomes more adhesive to avoid dropping off the workpieces. Referring to FIG. 4, after the coating process, the second rotor 294 is activated to drive the supporting trays 28 to rotate 90 degrees about the second axis so that the coating holder 20 occupies less space.

Figure 5:
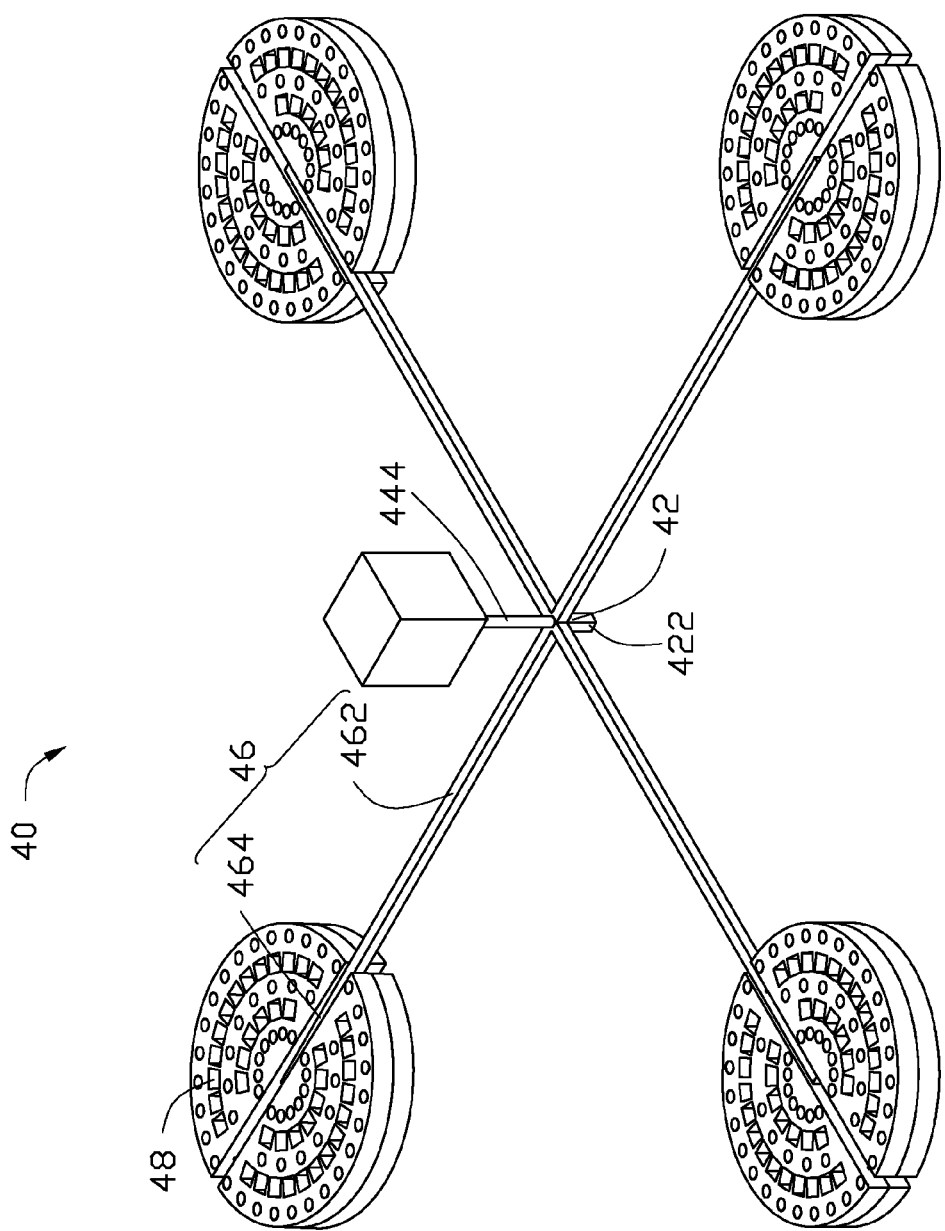
FIG. 5 is a schematic, isometric view of a coating holder, according to a second exemplary embodiment.
Figure 6:
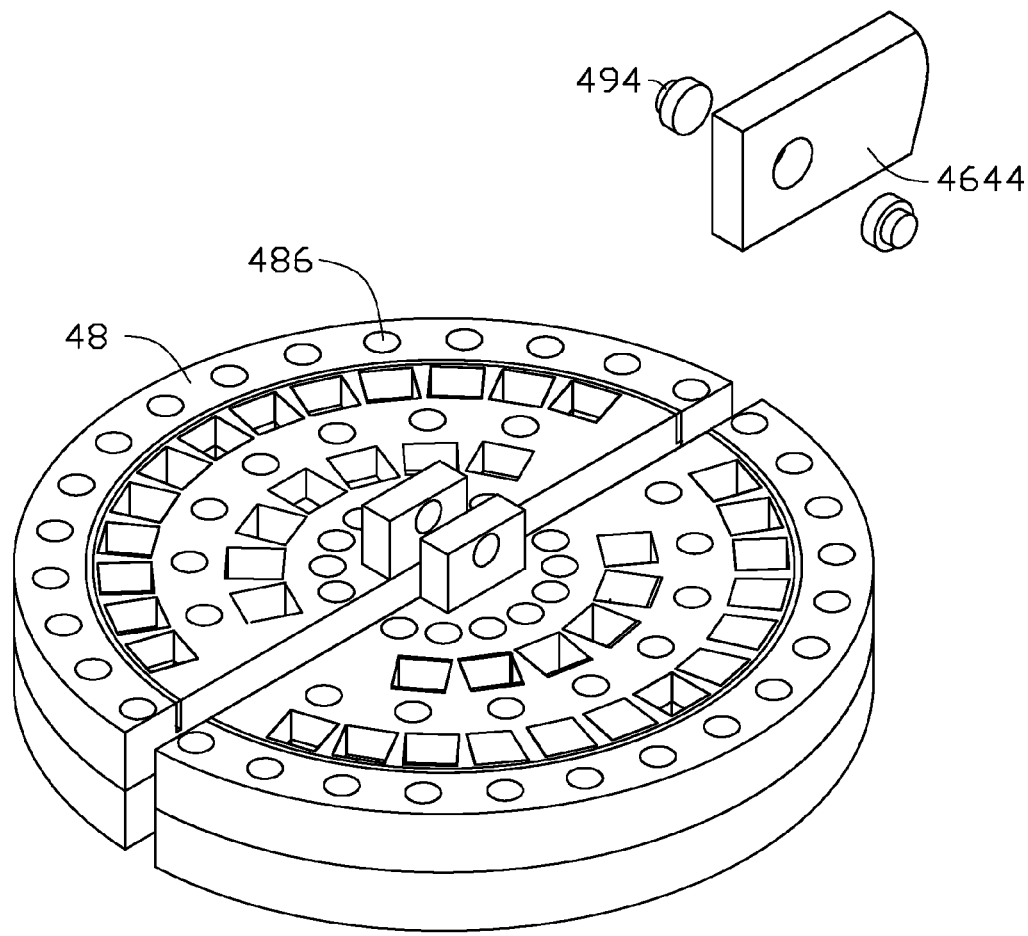
FIG. 6 is an enlarged isometric view of the coating holder of FIG. 5.

Referring to FIGS. 5-6, a coating holder 40 according to a second embodiment is shown. The differences between the coating holder 40 of this embodiment and the coating holder 20 of the first embodiment are that the hanging arms 46 of the holder 40 are straight beams. Each hanging arm 46 includes a connecting end 462 and a free end 464 opposite to the connecting end 462. The connecting end 462 perpendicularly extends from the rotating shaft 42. The bottom end 422 of the rotating shaft 42 is a free end.

Advantages of the coating holder 40 of the second embodiment are similar to those of the coating holder 20 of the first embodiment.

It is to be understood, however, that even though numerous characteristics and advantages of the present embodiments have been set fourth in the foregoing description, together with details of the structures and functions of the embodiments, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. A coating holder for holding a plurality of workpieces, comprising:
   a rotating shaft;
   a first driving member being a servomotor and comprising a first stator and a first rotor extending from the first stator, the first driving member configured for driving the rotating shaft to rotate about a first axis;
   a plurality of supporting trays configured for holding the workpieces;
   a plurality of hanging arms perpendicularly extending from the rotating shaft, each hanging arm comprising a free end distal from the rotating shaft, each free end having two of the supporting trays hanging therefrom;
   wherein the two supporting trays of each hanging arm comprises a main body, the main body comprises a first side and a second side opposite to the first side, the two supporting trays are rotatable about the second axis between a first position where the first sides of the supporting trays are substantially located on a common plane and face upward, and a second position where the second sides of the supporting trays are substantially located on a common plane and face upward;
   a plurality of second driving members, each second driving member being a servomotor and comprising a second stator and a second rotor extending from the second stator, wherein each free end is equipped with two of the second driving members on opposite surface thereof, the two supporting trays are hung on the opposite surface of the free end via the two second driving members, respectively, and the second driving members are configured for driving the supporting trays to rotate about a second axis substantially perpendicular to the first axis.

2. The coating holder as claimed in claim 1, wherein each hanging arm is substantially a straight beam, the hanging arm comprises a connection end perpendicularly extending from the rotating shaft and the free end opposite to the connection end, the two opposite surfaces of the free end are a first surface and a second surface, a first through hole is defined in the free end through the first surface and the second surface, a second through hole is defined in each of the two corresponding supporting trays, the two second stators are fixed in the first through hole back to back, and the two second rotors extend from the first through hole to engage in the respective second through holes such that the two supporting trays are hung on the first surface and the second surface, respectively.

3. The coating holder as claimed in claim 2, wherein each supporting tray comprises a protrusion, the protrusion extends from the first side, and the second through hole is defined in the protrusion.

4. The coating holder as claimed in claim 3, further comprising a plurality of magnets, wherein each supporting tray comprises a plurality of first recesses and a plurality of second recesses spaced apart from the first recesses, the first recesses are arranged in a plurality of first fan-shaped lines and configured for receiving the workpieces, the second recesses are arranged in a plurality of second fan-shaped lines and configured for receiving the magnets, and the first fan-shaped lines and the second fan-shaped lines are substantially parallel to each other and arranged alternately.

5. The coating holder as claimed in claim 4, wherein the magnetic poles of each of the magnets are exposed from the first side and the second side, respectively, the magnetic poles of the magnets in a given fan-shaped line exposed from the first side are contrary to those of the magnets in an adjacent fan-shaped line exposed from the first side, and the magnetic poles of the magnets in a given fan-shaped line exposed from the second side are contrary to those of the magnets in an adjacent fan-shaped line exposed from the second side.

6. The coating holder as claimed in claim 1, wherein each hanging arm comprises a connecting portion and a hanging portion, the connecting portion comprises a first end perpendicularly extending from the rotating shaft and a second end opposite to the first end, the hanging, portion comprises a third end perpendicularly extending from the second end and the free end opposite to the third end, the two opposite surfaces of the free end are a first surface and a second surface, a first through hole is defined in the free end through the first surface and the second surface, a second through hole is defined in each of the two corresponding supporting trays, the two second stators are fixed in the first through hole back to back, and the two second rotors extend from the first through hole to engage in the respective second through holes such that the two supporting trays are hung on the first surface and the second surface, respectively.

7. The coating holder as claimed in claim 6, wherein each supporting tray comprises a main body and a protrusion, the main body comprises a first side and a second side opposite to the first side, the protrusion extends from the first side, and the second through hole is defined in the protrusion.

8. The coating holder as claimed in claim 7, wherein the two supporting trays are rotatable about the second axis between a first position when the first sides of the supporting trays are substantially located on a common plane and face upward, and a second position where the second sides of the supporting trays are substantially located on a common plane and face upward.

9. The coating holder as claimed in claim 7, further comprising a plurality of magnets, wherein each supporting tray comprises a plurality of first recesses and a plurality of second recesses spaced apart from the first recesses, the first recesses are arranged in a plurality of first fan-shaped lines and configured for receiving the workpieces, the second recesses are arranged in a plurality of second fan-shaped lines and configured for receiving the magnets, and the first fan-shaped lines and the second fan-shaped lines are substantially parallel to each other and arranged alternately.

10. The coating holder as claimed in claim 9, wherein the magnetic poles of each of the magnets are exposed from the first side and the second side, respectively, the magnetic poles of the magnets in a given fan-shaped line exposed from the first side are contrary to those of the magnets in an adjacent fan-shaped line exposed from the first side, and the magnetic poles of the magnets in a given fan-shaped line exposed from the second side are contrary to those of the magnets in an adjacent fan-shaped line exposed from the second side.

11. The coating holder as claimed in claim 6, wherein the rotating shaft comprises a top end and a bottom end, a fixing hole is defined in the top end, the first rotor engages in the fixing, hole, the bottom end is equipped with two of the second driving members on opposite surfaces thereof, and two of the supporting trays are hung on the opposite surfaces of the bottom end via the two second driving members, respectively.

12. A coating device for coating a plurality of workpieces, comprising:
    a vacuum container;
    a plasma source received in the vacuum container; and
    a coating holder received in the vacuum container facing the plasma source, the coating holder configured for holding the workpieces, the coating holder comprising:
    a rotating shaft;
    a first driving member being a servomotor and comprising a first stator and a first rotor extending from the first stator, the first driving member configured for driving the rotating shaft to rotate about a first axis;
    a plurality of supporting trays configured for holding the workpieces;
    a plurality of hanging arms perpendicularly extending from the rotating shaft, each hanging arm comprising a free end distal from the rotating shaft, each free end having two of the supporting trays hanging therefrom;
    wherein the two supporting trays of each hanging arm comprises a main body, the main body comprises a first side and a second side opposite to the first side, the two supporting trays are rotatable about the second axis between a first position where the first sides of the supporting trays are substantially located on a common plane and face upward, and a second position where the second sides of the supporting trays are substantially located on a common plane and face upward;
    a plurality of second driving members, each second driving member being a servomotor and comprising a second stator and a second rotor extending from the second stator, wherein each free end is equipped with two of the second driving members on opposite surface thereof, the two supporting trays are hung on the opposite surface of the free end via the two second driving members, respectively, and the second driving members are configured for driving the supporting trays to rotate about a second axis substantially perpendicular to the first axis.

13. The coating device as claimed in claim 12, wherein each hanging arm comprises a connecting portion and a hanging portion, the connecting portion comprises a first end perpendicularly extending from the rotating shaft and a second end opposite to the first end, the hanging portion comprises a third end perpendicularly extending from the second end and the free end opposite to the third end, the two opposite surfaces of the free end are a first surface and a second surface, a first through hole is defined in the free end through the first surface and the second surface, a second through hole is defined in each of the two corresponding supporting trays, the two second stators are fixed in the first through hole back to hack, and the two second rotors extend from the first through hole to engage in the respective second through holes such that the two supporting trays are hung on the first surface and the second surface, respectively.

14. The coating holder as claimed in claim 13, wherein each supporting tray comprises a protrusion, the protrusion extends from the first side, and the second through hole is defined in the protrusion.

15. The coating device as claimed in claim 14, further comprising a plurality of magnets, wherein each supporting tray comprises a plurality of first, recesses and a plurality of second recesses spaced apart from the first recesses, the first recesses are arranged in a plurality of first fan-shaped lines and configured for receiving the workpieces, the second recesses are arranged in a plurality of second fan-shaped lines and configured for receiving the magnets, and the first fan-shaped lines and the second fan-shaped lines are substantially parallel to each other and arranged alternately.

16. The coating device as claimed in claim 15, wherein the magnetic poles of each of the magnets are exposed from the first side and the second side, respectively, the magnetic poles of the magnets in a given fin-shaped line exposed from the first side are contrary to those of the magnets in an adjacent fan-shaped line exposed from the first side, and the magnetic poles of the magnets in a given fan-shaped line exposed from the second side are contrary to those of the magnets in an adjacent fan-shaped line exposed from the second side.

17. The coating, device as claimed in claim 13, wherein the rotating shaft comprises a top end and a bottom end, a fixing hole is defined in the top end, the first rotor engages in the fixing hole, the bottom end is equipped with two of the second driving members on opposite surfaces thereof, and two of the supporting trays are hung on the opposite surfaces of the bottom end via the two second driving members, respectively.

18. The coating device as claimed in claim 12, wherein each hanging arm is substantially a straight beam, the hanging arm comprises a connection end perpendicularly extending from the rotating shaft and the free end opposite to the connection end, the two opposite surfaces of the free end are a first surface and a second surface, a first through hole is defined in the free end through the first surface and the second surface, a second through hole is defined in each of the two corresponding supporting trays, the two second stators are fixed in the first through hole back to back, and the two second rotors extend from the first through hole to engage in the respective second through holes such that the two supporting trays are hung on the first surface and the second surface, respectively.

* * * * *